(12) United States Patent
Kawata

(10) Patent No.: US 12,317,416 B2
(45) Date of Patent: May 27, 2025

(54) WIRING BOARD, SEMICONDUCTOR DEVICE, AND METHOD OF MANUFACTURING WIRING BOARD

(71) Applicant: KIOXIA CORPORATION, Tokyo (JP)

(72) Inventor: Tomonori Kawata, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 66 days.

(21) Appl. No.: 17/841,426

(22) Filed: Jun. 15, 2022

(65) Prior Publication Data

US 2023/0292435 A1    Sep. 14, 2023

(30) Foreign Application Priority Data

Mar. 11, 2022  (JP) .................................. 2022-038193

(51) Int. Cl.
*H05K 1/11* (2006.01)
*H01L 21/48* (2006.01)
(Continued)

(52) U.S. Cl.
CPC ............ *H05K 1/111* (2013.01); *H01L 21/486* (2013.01); *H01L 23/13* (2013.01); *H01L 23/49838* (2013.01); *H01L 23/5386* (2013.01); *H05K 1/113* (2013.01); *H05K 1/181* (2013.01); *H05K 1/183* (2013.01); *H05K 3/0029* (2013.01); *H05K 3/0035* (2013.01); *H05K 3/0038* (2013.01); *H05K 3/027* (2013.01); *H01L 24/13* (2013.01); *H01L 24/16* (2013.01); *H01L 24/81* (2013.01); *H01L 2224/13139* (2013.01); *H01L 2224/16227* (2013.01); *H01L 2224/16237* (2013.01); *H01L 2224/16238* (2013.01); *H01L 2224/81192* (2013.01); *H01L 2224/81801* (2013.01); *H05K 3/341* (2013.01); *H05K 3/3457* (2013.01);
(Continued)

(58) Field of Classification Search
CPC ...... H05K 1/111; H05K 1/113; H05K 3/0029; H05K 3/0035; H01L 21/486
USPC ........................................................ 174/260
See application file for complete search history.

(56) References Cited

U.S. PATENT DOCUMENTS

2004/0218084 A1    11/2004   Komoro et al.
2011/0292625 A1*  12/2011   Chen .................... H05K 1/0295
                                                            361/768
(Continued)

FOREIGN PATENT DOCUMENTS

CN          101165968 B  * 11/2011
JP          2002-076314 A    3/2002
(Continued)

*Primary Examiner* — Andargie M Aychillhum
(74) *Attorney, Agent, or Firm* — Maier & Maier, PLLC

(57) ABSTRACT

A wiring board includes: a first insulating layer; a first pad region provided above the first insulating layer and having a first connection pad; a second insulating layer provided above the first connection pad and having a first opening to expose the first connection pad; a second pad region provided above the second insulating layer and having a second connection pad electrically connected to the first connection pad; and a third insulating layer provided above the second connection pad, and having a second opening to exposes the first and second connection pads. The first connection pad region is smaller than the second connection pad region.

11 Claims, 11 Drawing Sheets

(51) Int. Cl.
*H01L 23/13* (2006.01)
*H01L 23/498* (2006.01)
*H01L 23/538* (2006.01)
*H05K 1/18* (2006.01)
*H05K 3/00* (2006.01)
*H05K 3/02* (2006.01)
*H01L 23/00* (2006.01)
*H05K 3/34* (2006.01)

(52) U.S. Cl.
CPC .............. *H05K 2201/09072* (2013.01); *H05K 2201/094* (2013.01); *H05K 2201/10015* (2013.01); *H05K 2201/10022* (2013.01)

(56) References Cited

U.S. PATENT DOCUMENTS

| | | |
|---|---|---|
| 2015/0131248 A1 | 5/2015 | Dakhiya et al. |
| 2015/0223318 A1* | 8/2015 | Sakamoto ............ H05K 1/0206 |
| | | 361/717 |
| 2020/0198520 A1* | 6/2020 | Tiramani .............. B62B 5/0086 |
| 2020/0227434 A1* | 7/2020 | Lee ........................ H10B 43/27 |
| 2020/0373244 A1* | 11/2020 | Kang .................. H01L 23/3672 |

FOREIGN PATENT DOCUMENTS

| | | | |
|---|---|---|---|
| JP | 2002-319745 A | 10/2002 | |
| JP | 2007-201197 A | 8/2007 | |
| WO | WO-2020150711 A1 * | 7/2020 | ........... H05K 1/0284 |

* cited by examiner

A1-B1 CROSS-SECTIONAL VIEW

<u>A2-B2 CROSS-SECTIONAL VIEW</u>

<u>A3-B3 CROSS-SECTIONAL VIEW</u>

A1-B1 CROSS-SECTIONAL VIEW

A2-B2 CROSS-SECTIONAL VIEW

A1-B1 CROSS-SECTIONAL VIEW

A2-B2 CROSS-SECTIONAL VIEW

A1-B1 CROSS-SECTIONAL VIEW

A2-B2 CROSS-SECTIONAL VIEW

A1-B1 CROSS-SECTIONAL VIEW

A2-B2 CROSS-SECTIONAL VIEW

A1-B1 CROSS-SECTIONAL VIEW

A2-B2 CROSS-SECTIONAL VIEW

A1-B1 CROSS-SECTIONAL VIEW

A2-B2 CROSS-SECTIONAL VIEW

WIRING BOARD, SEMICONDUCTOR DEVICE, AND METHOD OF MANUFACTURING WIRING BOARD

CROSS-REFERENCE TO RELATED APPLICATION

This application is based upon and claims the benefit of priority from Japanese Patent Application No. 2022-038193, filed on Mar. 11, 2022; the entire contents of which are incorporated herein by reference.

FIELD

Embodiments described herein relate to a wiring board and a semiconductor device.

BACKGROUND

In recent years, the development of communication technology and information processing technology requires miniaturization and high speed of semiconductor devices. To meet this demand, a semiconductor package having a three-dimensional structure of stacked semiconductor chips has been developed.

An example of the semiconductor package has a film-on-device (FOD) structure formed by mounting a chip component onto a printed wiring board and connecting a connection pad of the printed wiring board to the chip component.

DETAILED DESCRIPTION

Figure 1:
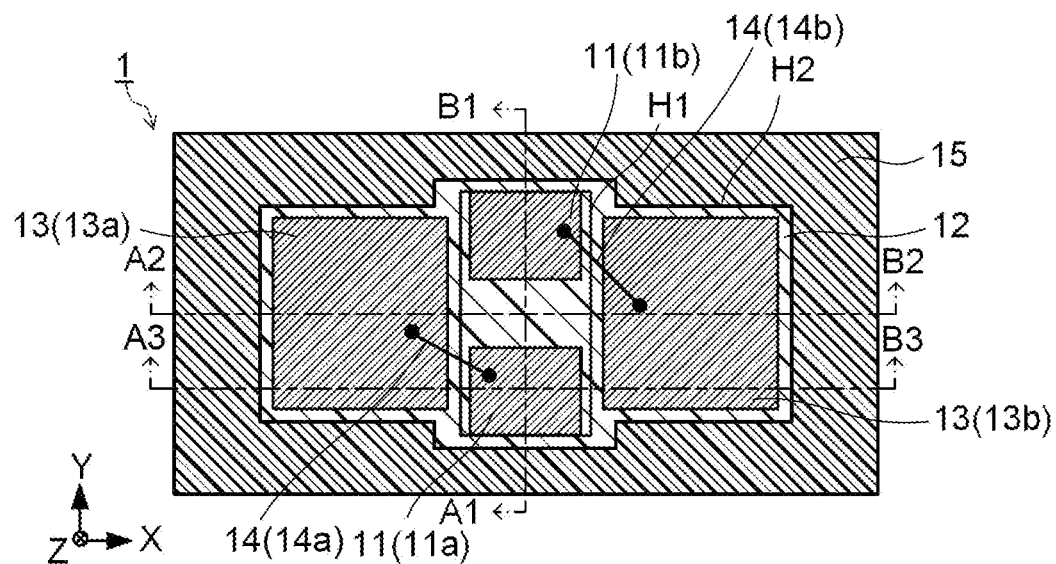
FIG. 1 is a schematic top view illustrating a structure example of a wiring board 1.

A wiring board in an embodiment includes: a first insulating layer; a first pad region provided above the first insulating layer and having a first connection pad; a second insulating layer provided above the first connection pad, and having a first opening to expose the first connection pad; a second pad region provided above the second insulating layer and having a second connection pad electrically connected to the first connection pad; and a third insulating layer provided above the second connection pad, and having a second opening to exposes the first and second connection pads. The first connection pad region is smaller than the second connection pad region.

There will be explained an embodiment below with reference to the drawings. The relation between the thickness and the planer dimension of each constituent element, a thickness ratio among the constituent elements, and so on illustrated in the drawings may be different from actual ones. Further, in the embodiment, substantially the same constituent elements are denoted by the same reference numerals and symbols, and explanation thereof will be appropriately omitted.

(Structure Example of a Wiring Board)

Figure 2:
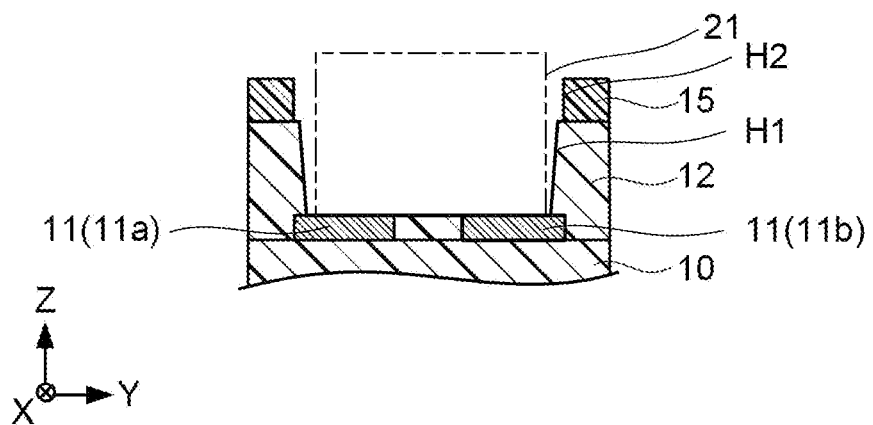
FIG. 2 is a schematic cross-sectional view illustrating a structure example of the wiring board 1.
Figure 3A:
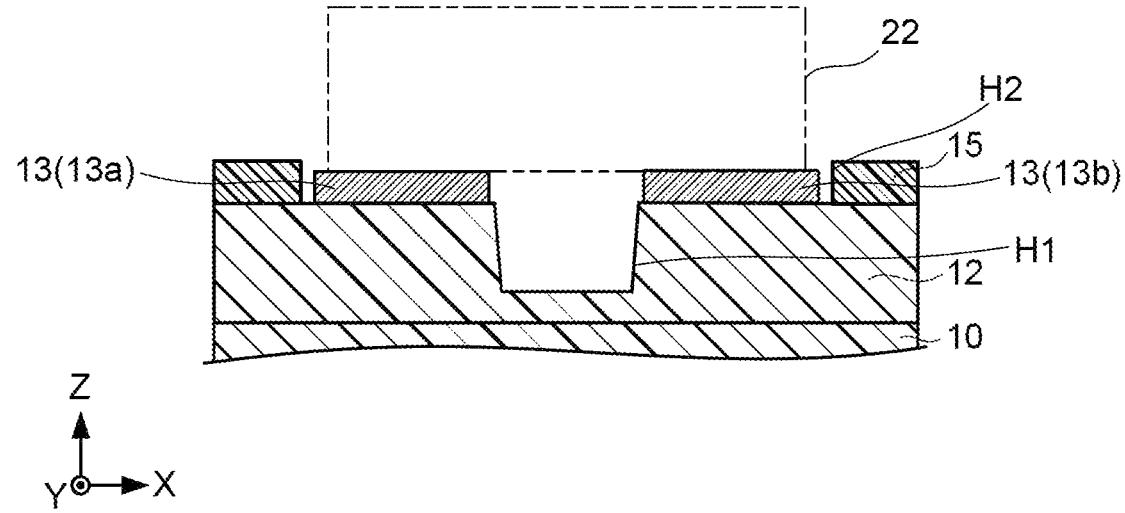
FIG. 3A is a schematic cross-sectional view illustrating a structure example of the wiring board 1.

A structure example of a wiring board in an embodiment is explained with reference to FIG. 1, FIG. 2, and FIG. 3A. FIG. 1 is a schematic top view illustrating a structure example of a wiring board 1, illustrating a portion of the X-Y plane having the X-axis and the Y-axis orthogonal to the X-axis of a chip mounting surface of the wiring board 1. The Z-axis vertical to the chip mounting surface extends along a stacking direction (thickness direction). FIG. 2 is a schematic cross-sectional view illustrating a structure example of the wiring board 1, illustrating an example of a cross section of the wiring board 1 taken along the line segment A1-B1 along the Y-axis direction of the chip mounting surface in FIG. 1. FIG. 3A is a schematic cross-sectional view illustrating a structure example of the wiring board 1, illustrating an example of a cross section of the wiring board 1 taken along the line segment A2-B2 along the X-axis direction of the chip mounting surface in FIG. 1. The structure examples of the wiring board in FIG. 1, FIG. 2, and FIG. 3A are one example, and the structure example of the wiring board in the embodiment is not limited to these structure examples.

Examples of the wiring board 1 includes a printed wiring board. The wiring board 1 includes an insulating layer 10, a plurality of connection pads 11, an insulating layer 12, a plurality of connection pads 13, a plurality of connection parts 14, and an insulating layer 15. A plurality of internal wiring layers may be formed inside the wiring board 1.

Examples of the insulating layer 10 include a prepreg. The prepreg is a sheet type material such as a glass cloth in which resin is immersed, for example. The insulating layer 10 is not limited to the prepreg, and examples of the insulating layer 10 may include a glass substrate, a ceramic substrate, and a resin substrate such as glass epoxy substrate. In this case, the substrate may be flexible. FIG. 2 and FIG. 3A partially illustrates the insulating layer 10 for convenience.

The connection pads 11 are provided above the insulating layer 10 in the Z-axis direction, for example. The connection pads 11 are provided on the insulating layer 10, for example. The connection pads 11 include a connection pad 11a and a connection pad 11b. The number of connection pads 11 is not limited to two (11a, 11b) as illustrated in FIG. 1, and may be three or more.

The connection pads 11a is apart from the connection pad 11b and the both connection pads 11a and 11b (hereinafter sometimes called just "connection pads 11") are arranged in the Y-axis direction of an upper surface (the chip mounting surface) of the wiring board 1, for example. The connection pads 11 are provided for mounting a chip component 21, for example. The two-dot chain line in FIG. 2 is an imaginary line, and the region surrounded by the two-dot chain line defines the region of the chip component 21 when the chip component 21 is mounted. The connection pads 11 are formed by using a metal material such as copper, for example.

The insulating layer 12 is provided above the connection pads 11 so as to overlap a portion of each of the connection pads 11 from the insulating layer 10 in the Z-axis direction, for example. The insulating layer 12 has an opening H1 that exposes another portion of each of the connection pads 11. That is, at least a portion of each of the connection pads 11 is exposed from the insulating layer 12. The opening H1 is formed by partially removing the insulating layer 12, for example. Examples of the insulating layer 12 include a prepreg, as similar to the insulating layer 10.

The connection pads 13 are provided above the insulating layer 12 in the Z-axis direction, for example. The connection pads 13 are provided on the insulating layer 12, for example. The connection pads 13 are electrically connected to the connection pads 11 via the connection parts 14, for example. The connection pads 13 include a connection pad 13a and a connection pad 13b. The connection parts 14 include a connection part 14a and a connection part 14b. The connection pad 13a is electrically connected to the connection pad 11a via the connection part 14a. The connection pad 13b is electrically connected to the connection pad 11b via the connection part 14b. The number of connection pads 13 is not limited to two (13a, 13b) as illustrated in FIG. 1, and may possibly be three or more.

The connection pad 13a is apart from the connection pad 13a and the both connection pads 13a and 13b (hereinafter sometimes called just "connection pads 13") are arranged in the X-axis direction of the chip mounting surface of the wiring board 1, for example. The connection pads 13 are provided for mounting a chip component 22 that is larger in size than the chip component 21, for example. The two-dot chain line in FIG. 3A is an imaginary line, and the region surrounded by the two-dot chain line defines the region of the chip component 22 when the chip component 22 is mounted. The connection pads 13 are formed by using a metal material such as copper, for example. FIG. 3A illustrates an example where the connection pads 13 are formed on the upper surface of the wiring board 1, but the connection pads 13 are not limited to this structure, and the connection pads 13 may be provided in an inner layer of the wiring board 1.

Figure 3B:
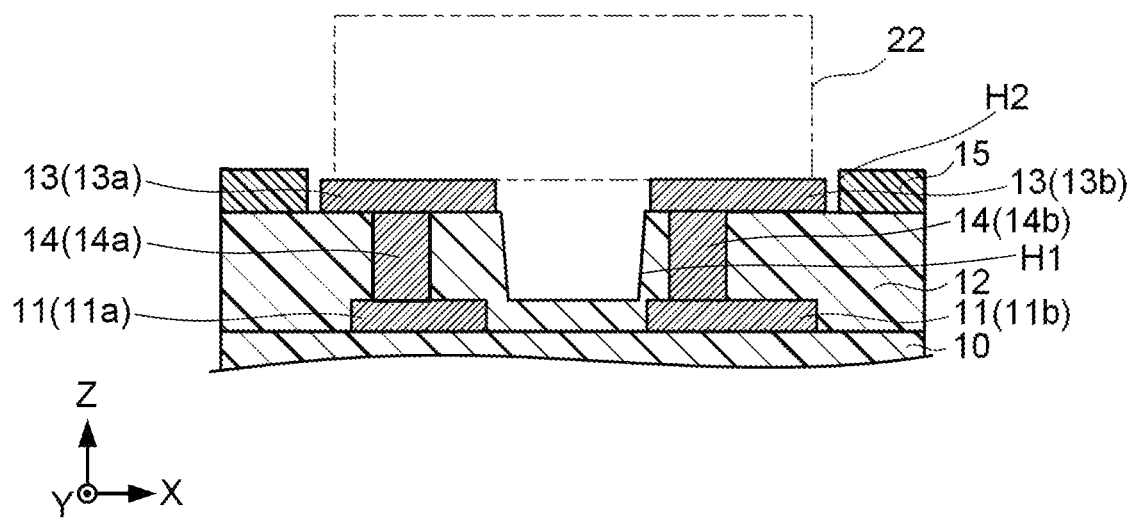
FIG. 3B is a schematic cross-sectional view illustrating the structure example of the wiring board 1.

One of the connection parts 14 electrically connects one of the connection pads 11 and one of the connection pads 13. The other of the connection parts 14 electrically connects the other of the connection pads 11 and the other of the connection pads 13. FIG. 1 schematically illustrates the connection part 14a and the connection part 14b as the connection parts 14. Examples of the connection parts 14 may include a wiring or a via. That is, the connection part 14 may be formed of a wiring as illustrated in FIG. 1 or may be formed of a via as illustrated in FIG. 3B. FIG. 3B illustrates an example of a cross section of the wiring board 1 taken along the line segment A3-B3 along the X-axis direction of the chip mounting surface in FIG. 1. The positions of the connection parts 14 are not limited. When the connection parts 14 are formed of vias, the connection parts 14 are formed by using a metal material such as copper, for example.

The insulating layer 15 is provided above the connection pads 13 from the insulating layer 12. The insulating layer 15 is provided on the insulating layer 12, for example. Examples of the insulating layer 15 include a solder resist. The insulating layer 15 has an opening H2 that exposes the connection pads 11 and the connection pads 13. The connection pads 11 and the connection pads 13 only need to be partially exposed from the insulating layer 15. The opening H2 is formed by partially removing the insulating layer 15 for the connection pads being partially exposed, for example.

Examples of the chip component 21 and the chip component 22 include a chip resistor, and a chip capacitor. The chip component 21 and the chip component 22 have the same function as each other. For example, if the chip component 21 is a chip resistor, the chip component 22 is also a chip resistor, and if the chip component 21 is a chip capacitor, the chip component 22 is also a chip capacitor. Either the chip component 21 or the chip component 22 is mounted on the wiring board 1.

Figure 4:
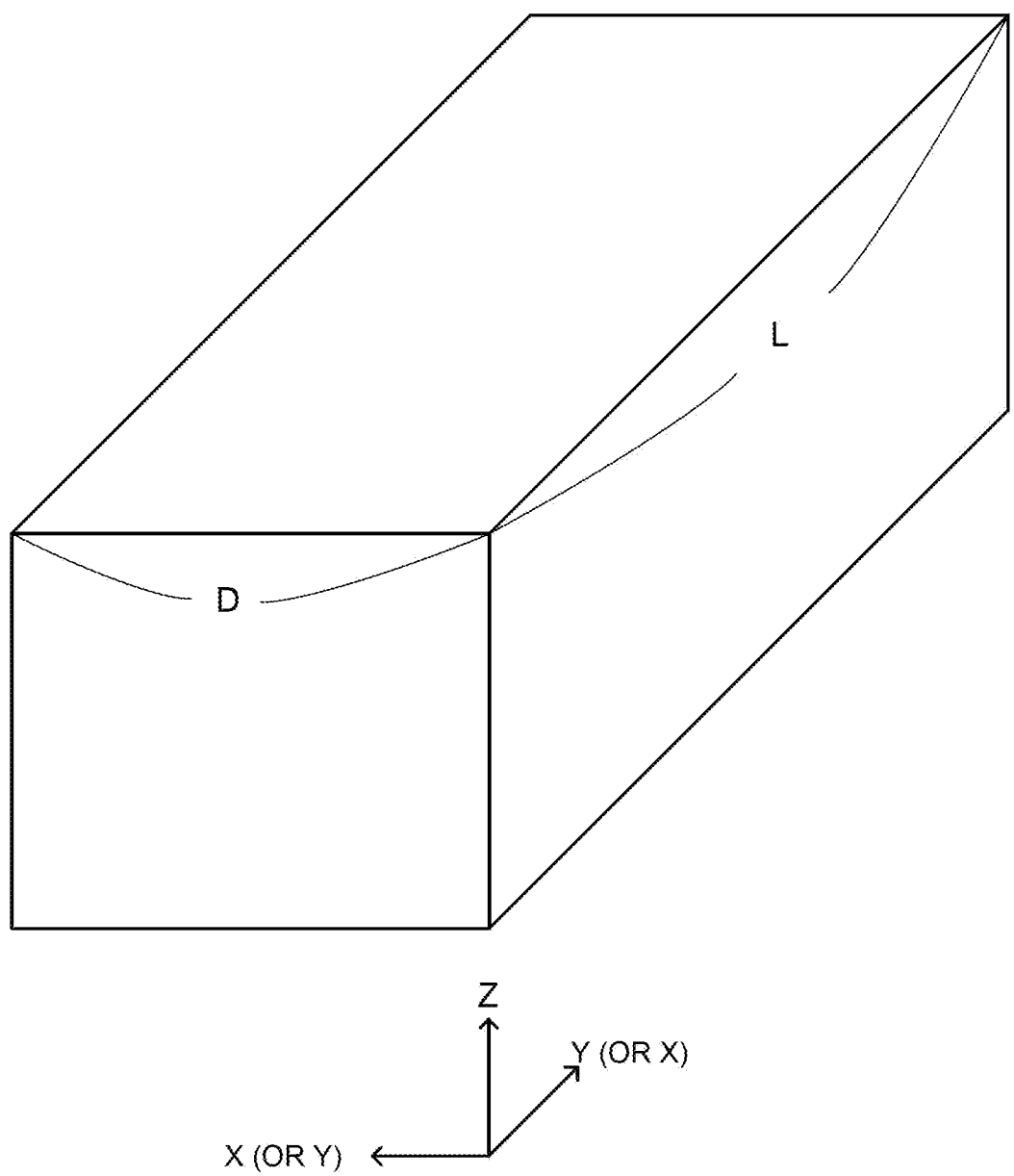
FIG. 4 is a schematic view for explaining a size of a chip component.

The chip component 21 and the chip component 22 have different sizes. The size of these chip components can be expressed by an abbreviation consisting of a four- or five-digit number specified according to the combination of a length L (mm) of the chip component×a width D (mm) of the chip component, for example, by the Japanese Industrial Standards (JIS) or the Electronic Industries Alliance (EIA) standards. FIG. 4 is a three-dimensional schematic view for explaining the size of the chip component. Table 1 illustrates the relationship between a size of a chip component and an abbreviation of a size (L, D). For example, when the chip component 22 is a chip represented by 0603 in JIS abbreviation, the chip component 21 is a chip represented by 0402 in JIS abbreviation. As illustrated, the chip component 22 has a larger size than the chip component 21 in this embodiment.

TABLE 1

| Length L (mm) | Width D (mm) | JIS abbreviation (mm notation) | EIA abbreviation (inch notation) |
| --- | --- | --- | --- |
| 0.4 | 0.2 | 0402 | 01005 |
| 0.6 | 0.3 | 0603 | 0201 |
| 1.0 | 0.5 | 1005 | 0402 |

TABLE 1-continued

| Length L (mm) | Width D (mm) | JIS abbreviation (mm notation) | EIA abbreviation (inch notation) |
|---|---|---|---|
| 1.6 | 0.8 | 1608 | 0603 |
| 2.0 | 1.25 | 2012 | 0805 |
| 3.2 | 1.6 | 3216 | 1206 |
| 3.2 | 2.5 | 3225 | 1210 |
| 5.0 | 2.5 | 5025 | 2010 |
| 6.4 | 3.2 | 6432 | 2512 |

The region surrounded by the two-dot chain line in FIG. 3A where the chip component is mounted includes an area having the connection pads for the chip component (to be also referred to as a pad region, here). That is, the area of the chip component and the area of the pad region are almost equal, if seen from X-Y plane, although the pad region is slightly larger. Therefore, the size of the pad region is designed slightly larger than the size of the chip component to be mounted.

In general, the connection pad is to design totally so as to optimize the wiring board, considering the connection relationship with another chip component, electrical conditions of resistance and capacitance, and other factors. However, even if the connection pad is designed totally as described above, the chip component may be replaced with another chip component due to a change in specifications or other reasons. In this case, if the alternative chip component is the same in size as the chip component, the chip component can be simply replaced with the alternative chip component as is. But if the alternative chip component has a different size, the wiring board needs to be redesigned.

Therefore, the wiring board in this embodiment has a plurality of pad regions having different sizes. This structure can change the size of the chip component to be mounted without manufacturing or preparing a new wiring board even if it needs to change the size of the chip component to be mounted. Therefore, the wiring board according to the embodiment is able to provide a high versatility.

In order to make the size of the chip component to be mounted changeable, it is conceivable to form a plurality of connection pads having different sizes on the same surface of the wiring board. However, if the distance between the neighboring connection pads having different sizes becomes narrow, it becomes difficult to form a conductive layer for each of the connection pads.

In contrast, the wiring board according to the embodiment includes a plurality of the pad regions having different sizes in different layers of the wiring board and therefore the pad regions having different sizes are apart from each other in the Z-axis direction. This structure allows to form a conductive layer for each of the connection pads easily even if the distance between the neighboring connection pads having different sizes becomes narrow, if seen from X-Y plane.

The pad region of the chip component 21 having the connection pads 11 is smaller than that of the chip component 22 having the connection pads 13.

The connection pads 11a and 11b are arranged, if seen from X-Y plane, in a direction intersecting the direction of which the connection pads 13a and 13b are arranged. Further, the connection pads 11a and 11b are arranged between the connection pads 13a and the connection pad 13b in the X-axis direction. Either the chip component 21 or the chip component 22 is selectively mounted on the wiring board 1. Thus, such different layered arrangement can reduce the size of the mounting regions for these chip components. As a result, an occupancy area for the chip components 21 and 22 of the wiring board 1 can be reduced and therefore the wiring board 1 itself can be miniaturized rather than the case of forming the connection pads having on the same surface of the wiring board. Further, for example, an amount of the solder resist to be used for the insulating layer 15 can also be reduced. Further, the versatility when selectively mounting the chip component can be improved.

The width of each of the connection pads 11a and 11b in the X-axis direction may be smaller than the distance between the connection pads 13a and 13b in the X-axis direction. The distance between the connection pads 11a and 11b in the Y-axis direction may be smaller than the distance between the connection pads 13a and 13b in the X-axis direction.

(Structure Example of a Semiconductor Device)

Figure 5:
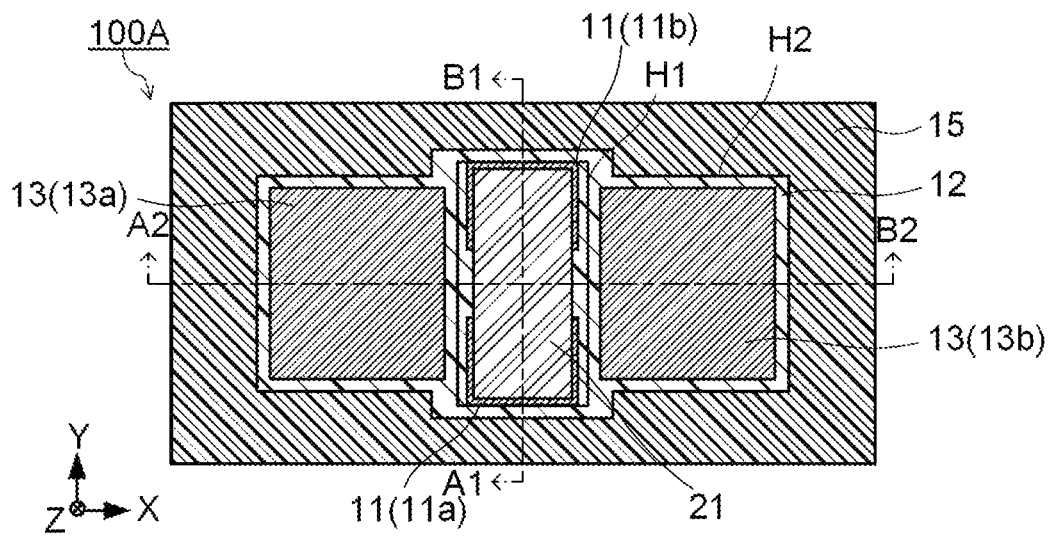
FIG. 5 is a schematic top view illustrating a structure example of a semiconductor device 100A.
Figure 6:
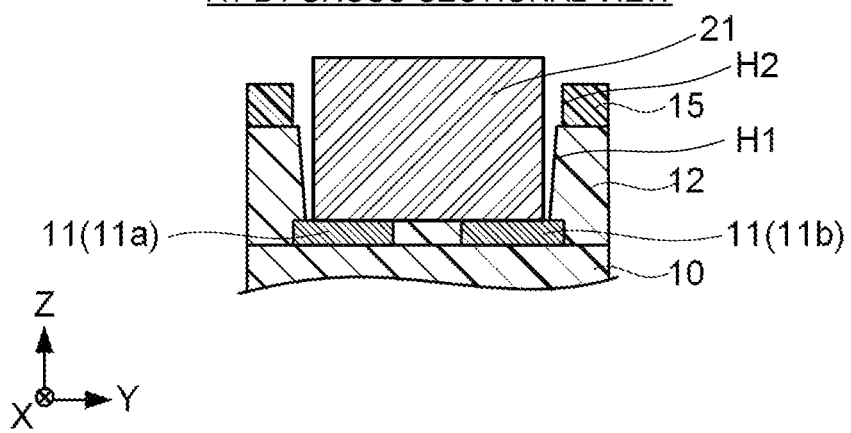
FIG. 6 is a schematic cross-sectional view illustrating the structure example of the semiconductor device 100A.
Figure 7:
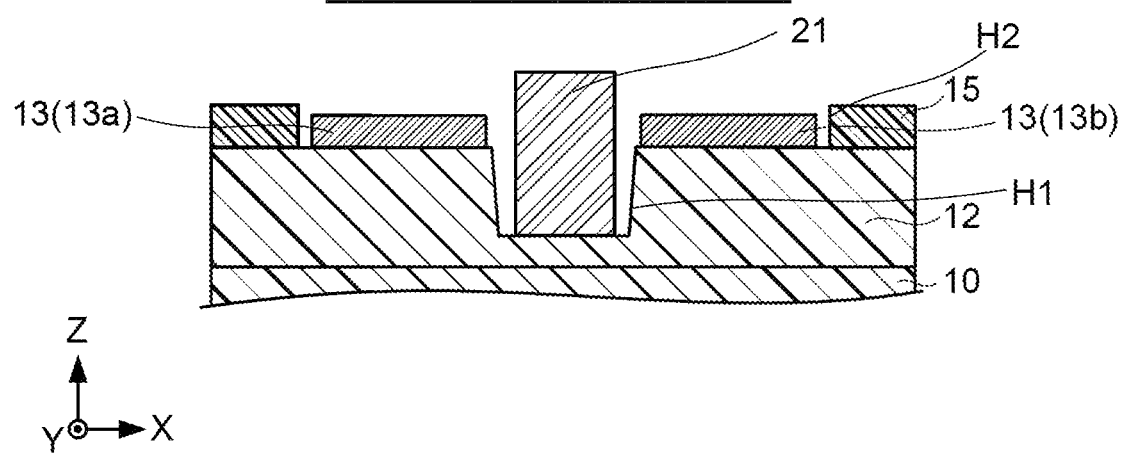
FIG. 7 is a schematic cross-sectional view illustrating the structure example of the semiconductor device 100A.

A structure example of a semiconductor device where the chip component 21 is mounted on the wiring board 1 is explained with reference to FIG. 5, FIG. 6, and FIG. 7. FIG. 5 is a schematic top view illustrating a structure example of a semiconductor device 100A, illustrating a portion of the X-Y plane having the X-axis and the Y-axis of the chip mounting surface of the wiring board 1. FIG. 6 is a schematic cross-sectional view illustrating the structure example of the semiconductor device 100A, taken along the line segment A1-B1 in FIG. 5. FIG. 7 is a schematic cross-sectional view illustrating the structure example of the semiconductor device 100A, taken along the line segment A2-B2 in FIG. 5. For each of the parts of the wiring board 1 illustrated in FIG. 5, FIG. 6, and FIG. 7 corresponding to the parts of the wiring board 1 illustrated in FIG. 1, FIG. 2, and FIG. 3A, an explanation for the parts of the wiring board 1 illustrated in FIG. 1, FIG. 2, and FIG. 3A can be appropriately cited if necessary.

When the chip component 21 is mounted on the wiring board 1, the chip component 21 is mounted on the connection pads 11 as illustrated in FIG. 5, FIG. 6, and FIG. 7. In this case, the chip component 21 is provided between the connection pad 13a and the connection pad 13b, and is not provided on the connection pads 13a and 13b.

Figure 8:
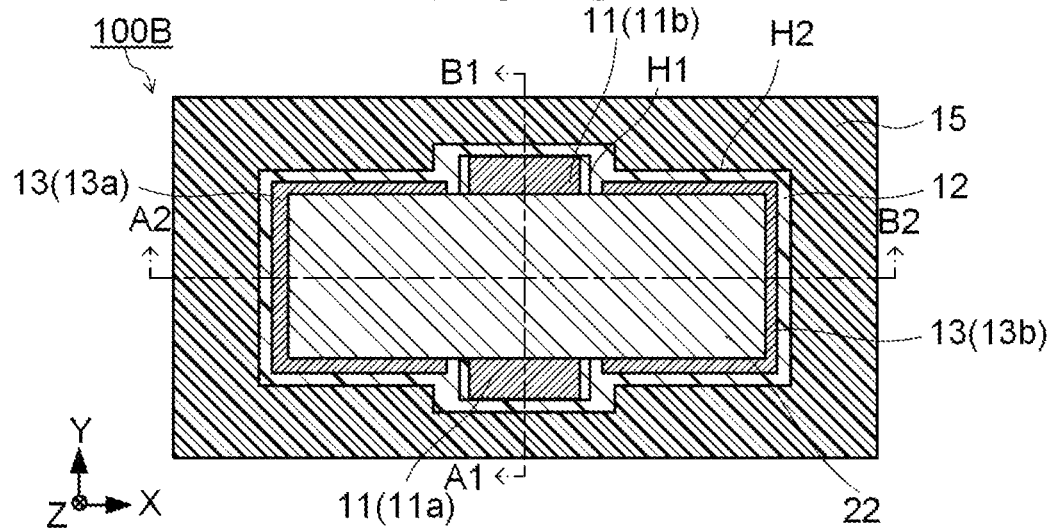
FIG. 8 is a schematic top view illustrating a structure example of a semiconductor device 100B.
Figure 9:
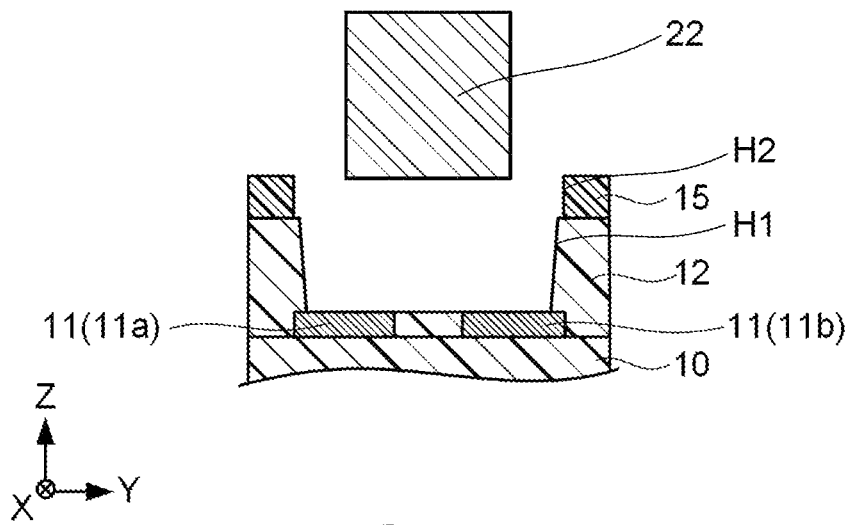
FIG. 9 is a schematic cross-sectional view illustrating the structure example of the semiconductor device 100B.
Figure 10:
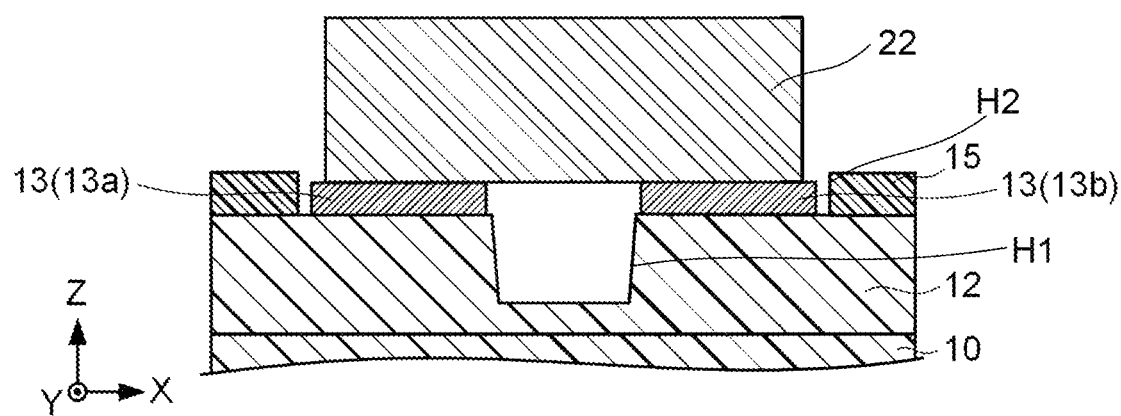
FIG. 10 is a schematic cross-sectional view illustrating the structure example of the semiconductor device 100B.

A structure example of the semiconductor device where the chip component 22 is mounted on the wiring board 1 is explained with reference to FIG. 8, FIG. 9, and FIG. 10. FIG. 8 is a schematic top view illustrating a structure example of a semiconductor device 100B, if seen from the X-Y plane. FIG. 9 is a schematic cross-sectional view illustrating the structure example of the semiconductor device 100B, taken along the line segment A1-B1 in FIG. 8. FIG. 10 is a schematic cross-sectional view illustrating the structure example of the semiconductor device 100B, taken along the line segment A2-B2 in FIG. 8. For each of the parts of the wiring board 1 illustrated in FIG. 8, FIG. 9, and FIG. 10 corresponding to the wiring board 1 illustrated in FIG. 1, FIG. 2, and FIG. 3A, an explanation for the parts of the wiring board 1 illustrated in FIG. 1, FIG. 2, and FIG. 3A can be appropriately cited if necessary.

When the chip component 22 is mounted on the wiring board 1, the chip component 22 is mounted on the connection pads 13 as illustrated in FIG. 8, FIG. 9, and FIG. 10. In this case, the chip component 22 is provided apart from the connection pads 11a and 11b in the Z-axis direction, and is not provided on the connection pads 11.

(Modified Example of the Wiring Board)

Figure 11:
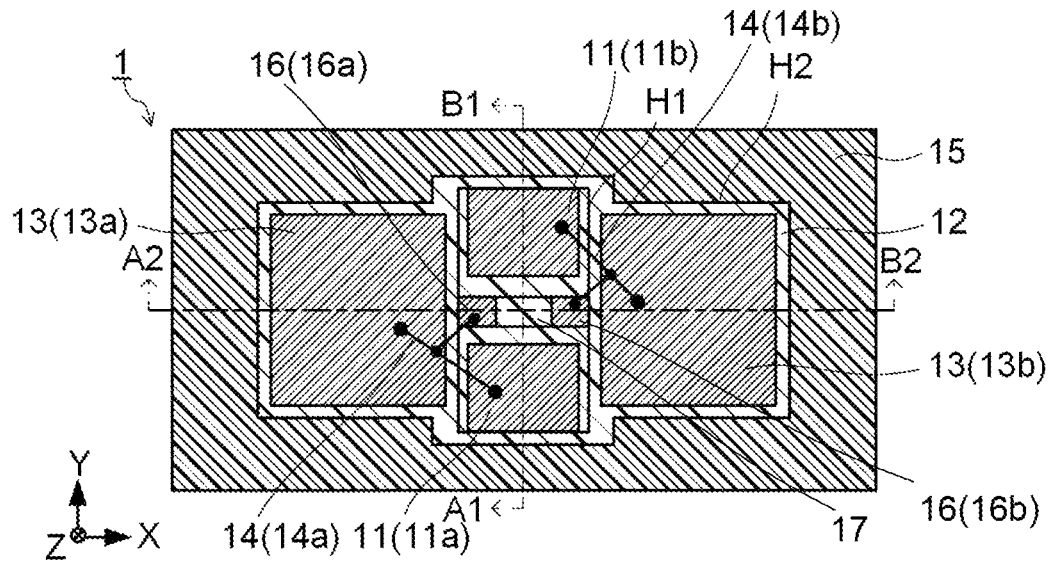
FIG. 11 is a schematic top view illustrating a structure example of the wiring board 1.
Figure 12:
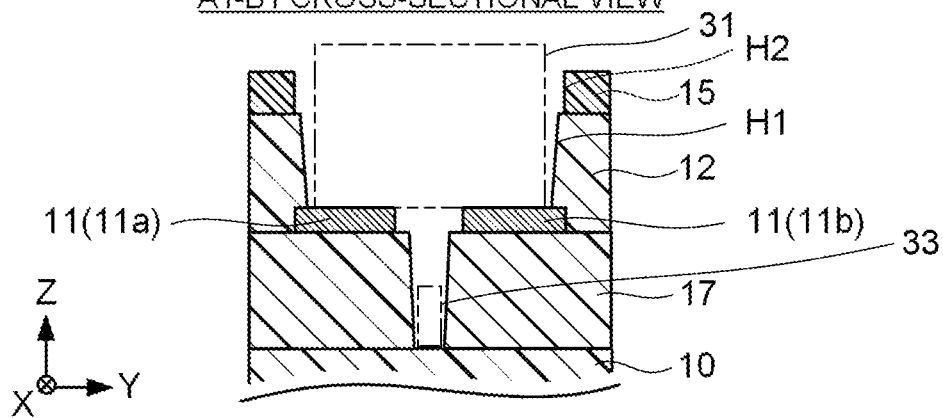
FIG. 12 is a schematic cross-sectional view illustrating a structure example of the wiring board 1.
Figure 13:
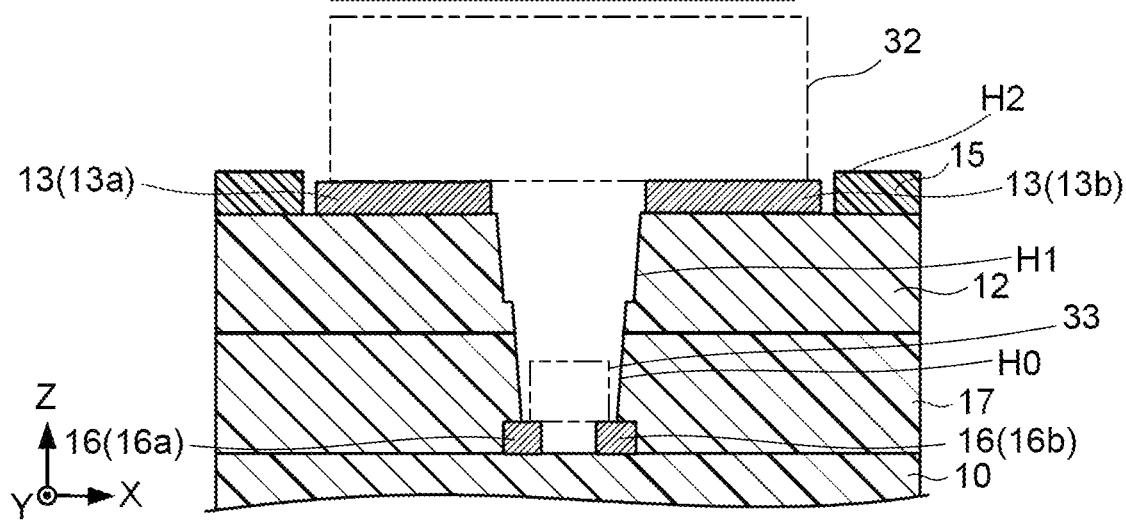
FIG. 13 is a schematic cross-sectional view illustrating a structure example of the wiring board 1.

The wiring board 1 may further include connection pads different from the connection pads 11 and the connection pads 13. A modified example of the wiring board in the embodiment is explained with reference to FIG. 11, FIG. 12, and FIG. 13. FIG. 11 is a schematic top view illustrating another structure example of the wiring board 1, if seen from X-Y plane. FIG. 12 is a schematic cross-sectional view illustrating another structure example of the wiring board 1, taken along the line segment A1-B1 in FIG. 11. FIG. 13 is a schematic cross-sectional view illustrating another structure example of the wiring board 1, taken along the line segment A2-B2 in FIG. 11. For each of the parts of the wiring board 1 illustrated in FIG. 11, FIG. 12, and FIG. 13 corresponding to the parts of the wiring board 1 illustrated in FIG. 1, FIG. 2, and FIG. 3A, an explanation for the parts of the wiring board 1 illustrated in FIG. 1, FIG. 2, and FIG. 3A can be appropriately cited if necessary.

The connection pads 11 illustrated in FIG. 11 are provided for mounting a chip component 31, for example. The two-dot chain line in FIG. 12 is an imaginary line. The upper region surrounded by the two-dot chain line defines the region of the chip component 31 when the chip component 31 is mounted. The lower region surrounded by the two-dot chain line defines the region of the chip component 33 when the chip component 33 is mounted.

The connection pads 13 illustrated in FIG. 13 are provided for mounting a chip component 32 that is larger in size than the chip component 31, for example. The two-dot chain line in FIG. 13 is an imaginary line. The upper region surrounded by the two-dot chain line defines the region of the chip component 32 when the chip component 32 is mounted. The lower region surrounded by the two-dot chain line defines the region of the chip component 33 when the chip component 33 is mounted.

The modified example of the wiring board 1 further includes a plurality of connection pads 16 and an insulating layer 17 between the insulating layers 10 and 12. The connection pads 16 includes a connection pad 16a and a connection pad 16b.

The connection pads 16 are provided above the insulating layer 10 in the Z-axis direction, for example. The connection pads 16 are provided on the insulating layer 10, for example. The connection pads 16 are electrically connected to the connection pads 11 and the connection pads 13 via the connection parts 14, for example. The connection pad 16a is electrically connected to the connection pad 11a and the connection pad 13a via the connection part 14a. The connection pad 16b is electrically connected to the connection pad 11b and the connection pad 13b via the connection part 14b. Examples of the connection parts 14a and 14b include a wiring or a via. The number of connection pads 16 is not limited to two (16a, 16b) as illustrated in FIG. 11, and may possibly be three or more.

The connection pads 16 are arranged in the X-axis direction of the chip mounting surface of the wiring board 1, for example. The connection pads 16 are provided for mounting a chip component 33 that is smaller in size than the chip component 31, for example. The connection pads 16 are formed by using a metal material such as copper, for example.

The insulating layer 17 is provided between the insulating layer 10 and the insulating layer 12. The insulating layer 17 is provided so as to overlap a portion of each of the connection pads 16 from the insulating layer 10 in the Z-axis direction, for example. The connection pads 11 are provided above the insulating layer 17. The insulating layer 17 has an opening H0 that exposes the other portion of each of the connection pads 16. That is, at least a portion of each of the connection pads 16 is exposed from the insulating layer 17. The opening H0 is formed by partially removing the insulating layer 17 for the connection pads 16 being partially exposed, for example. Examples of the insulating layer 17 include a prepreg, as similar to the insulating layer 10.

Examples of each of the chip component 31, the chip component 32, and the chip component 33 include a chip resistor, and a chip capacitor. The chip component 31, the chip component 32, and the chip component 33 have the same function as one another. For example, if the chip component 31 and the chip component 32 are a chip resistor, the chip component 33 is also a chip resistor, and if the chip component 31 and the chip component 32 are a chip capacitor, the chip component 33 is also a chip capacitor.

The chip component 31, the chip component 32, and the chip component 33 have different sizes. The size of these chip components can be represented by an abbreviation of JIS or EIA standards similarly to the chip component 21 and the chip component 23. For example, when the chip component 31 is a chip represented by 0603 in JIS abbreviation, the chip component 32 is a chip represented by 1005 in JIS abbreviation and the chip component 33 is a chip represented by 0402 in JIS abbreviation. As illustrated, the chip component 32 has a larger size than the chip components 31 and 33 in this embodiment, and the chip component 33 has a smaller size than the chip components 31 and 32 in this embodiment. Any component of the chip component 31, the chip component 32, and the chip component 33 is mounted on the wiring board 1.

Here, the area of the pad region having the connection pads 16 for the chip component 33 is smaller than the area of the pad region having the connection pads 11 for the chip component 31. This structure can change the size of the chip component to be mounted without manufacturing or preparing a new wiring board even if it needs to change the size of the chip component to be mounted. Therefore, the wiring board according to the embodiment is able to provide a high versatility. This modified example explains one example where three layers of connection pads having different heights in the Z-axis direction are provided, but four or more layers of connection pads may be further provided.

The connection pad 16a is apart from the connection pad 16b and the both connection pads 16a and 16b (hereinafter sometimes called just "connection pads 16") are arranged, if seen from X-Y plane, in a direction intersecting the direction of which the connection pads 11a and 11b are arranged. Further, the connection pads 16a and 16b are provided between the connection pads 11a and 11b in the Y-axis direction. When any one of the chip component 31, the chip component 32, and the chip component 33 is selectively mounted on the wiring board 1 and the connection pads 11, 13 and 16 having different sizes are arranged in the Z-axis direction as in the modified example, an occupancy area for the chip component of the wiring board 1 can be reduced rather than the case of forming the connection pads having the different sizes on the same surface of the wiring board 1. Further, for example, an amount of the solder resist to be used for the insulating layer 15 can also be reduced. In addition, the versatility when selectively mounting the chip component can be improved.

The width of each of the connection pads 16a and 16b in the Y-axis direction may be smaller than the distance between the connection pads 11a and 11b in the Y-axis direction. The distance between the connection pads 16a and 16b in the X-axis direction may be smaller than the distance between the connection pads 11a and 11b in the Y-axis direction. This can reduce the mounting region of the chip component 33 to reduce the area of the wiring board 1. This modified example is shown as the connection pads 11, the connection pads 13, and the connection pads 16 are connected and any one of the chip components is selectively arranged, the connection parts 14 may be formed so that two of the chip components can be selectively arranged, depending on each size of the selected chip components.

(Method Example of Manufacturing the Wiring Board)

Figure 14:
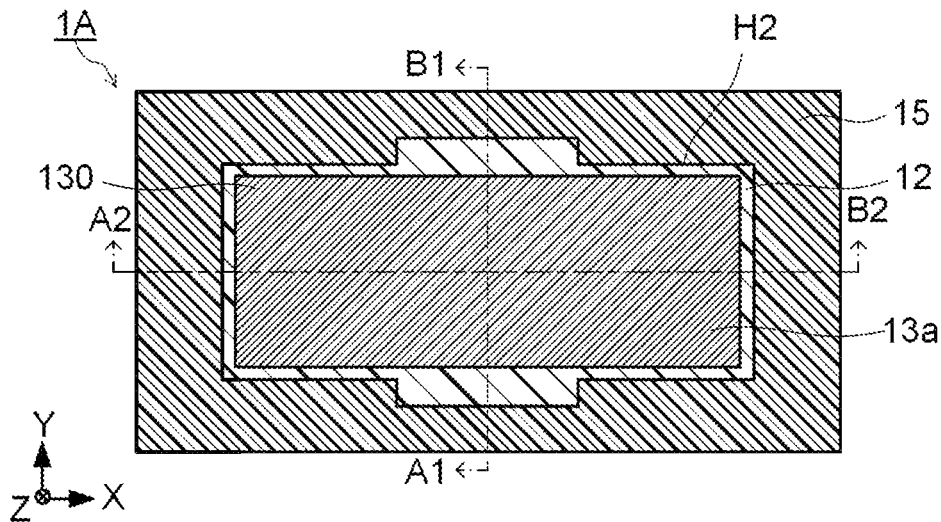
FIG. 14 is a schematic top view illustrating a structure example of the wiring board 1 in a preparation step.
Figure 15:
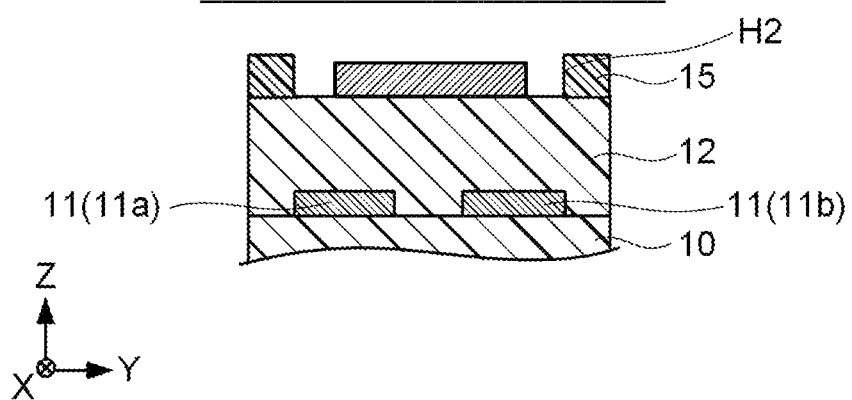
FIG. 15 is a schematic cross-sectional view illustrating the structure example of the wiring board 1.
Figure 16:
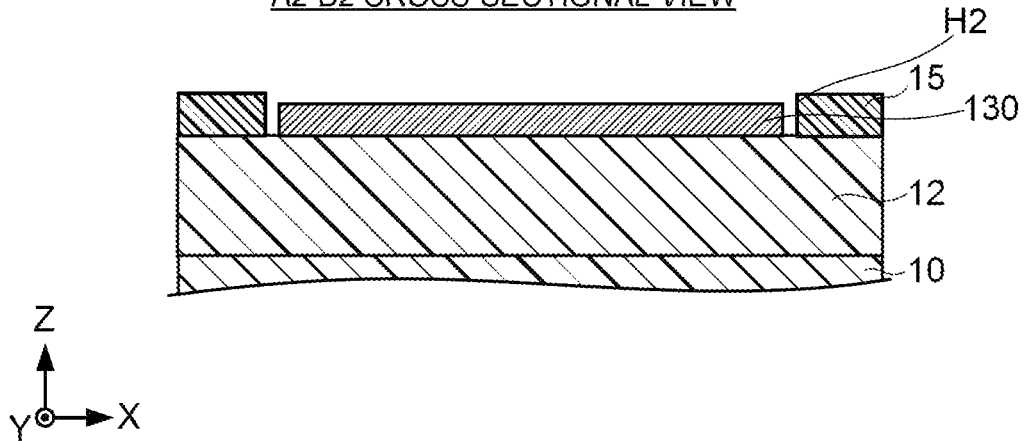
FIG. 16 is a schematic cross-sectional view illustrating the structure example of the wiring board 1.

A method example of manufacturing the wiring board, includes a preparation step and an opening step. FIG. 14 is a schematic top view illustrating a structure example of the wiring board 1 in the preparation step, illustrating a portion of the X-Y plane. The Z-axis vertical to the chip mounting surface extends in the stacking direction (the thickness direction of the wiring board 1) of the insulating layers 10 and 12. FIG. 15 is a schematic cross-sectional view illustrating the structure example of the wiring board 1, taken along the line segment A1-B1 in FIG. 14. FIG. 16 is a schematic cross-sectional view illustrating the structure example of the wiring board 1, taken along the line segment A2-B2 in FIG. 14. For each of the parts of the wiring board 1 illustrated in FIG. 14, FIG. 15, and FIG. 16 corresponding to the parts of the wiring board 1 illustrated in FIG. 1, FIG. 2, and FIG. 3A, an explanation for the parts of the wiring board 1 illustrated in FIG. 1, FIG. 2, and FIG. 3A can be appropriately cited if necessary.

In the preparation step, a stack 1A having the insulating layer 10, the connection pads 11, the insulating layer 12, a conductive layer 130, and the insulating layer is prepared. The stack 1A may include the connection parts 14 such as vias as illustrated in FIG. 3B.

The conductive layer 130 is provided above the insulating layer 12. The conductive layer 130 extends in the X-axis direction, for example. The conductive layer 130 is provided for forming the connection pads 13.

Figure 17:
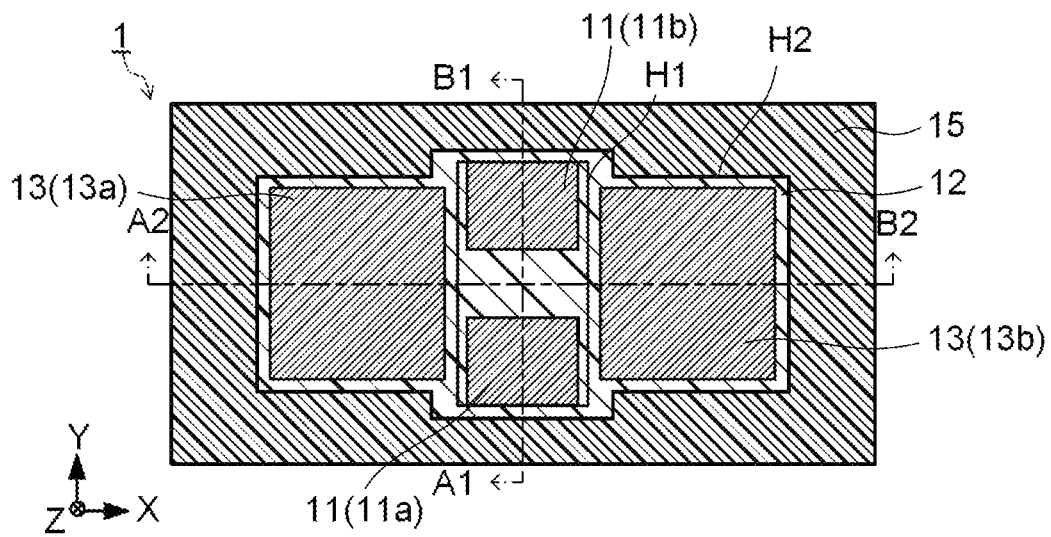
FIG. 17 is a schematic top view illustrating a structure example of the wiring board 1 in an opening step.
Figure 18:
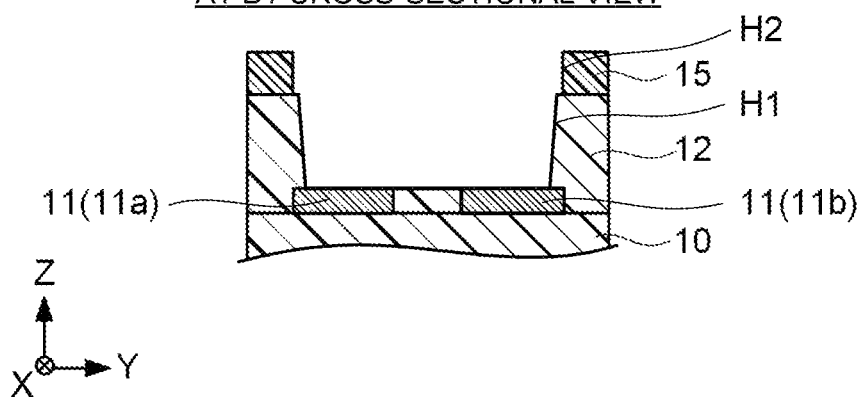
FIG. 18 is a schematic cross-sectional view illustrating the structure example of the wiring board 1.
Figure 19:
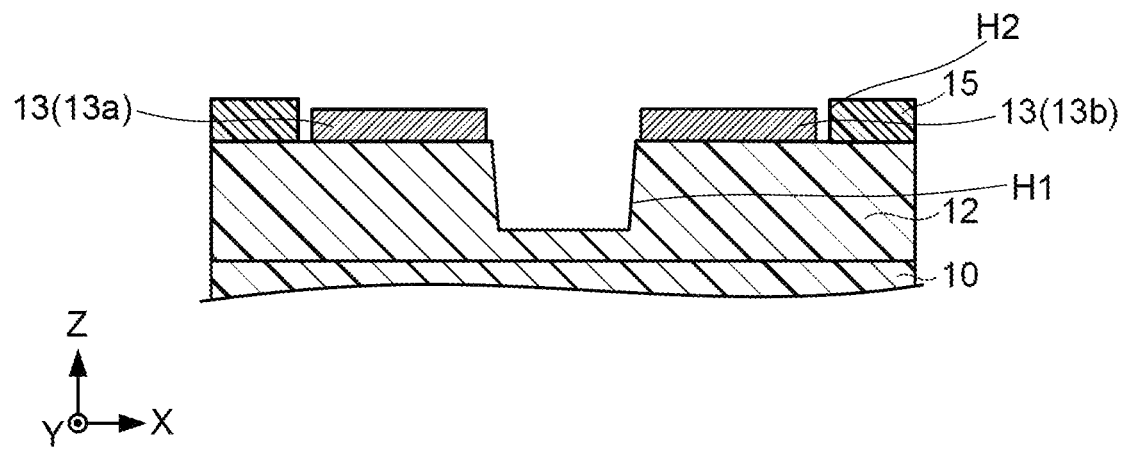
FIG. 19 is a schematic cross-sectional view illustrating the structure example of the wiring board 1.

FIG. 17 is a schematic top view illustrating a structure example of the wiring board 1 in the opening step, illustrating a portion of the X-Y plane. FIG. 18 is a schematic cross-sectional view illustrating the structure example of the wiring board 1, taken along the line segment A1-B1 in FIG. 17. FIG. 19 is a schematic cross-sectional view illustrating the structure example of the wiring board 1, taken along the line segment A2-B2 in FIG. 17.

In this opening step, a part of each of the insulating layer 12 and the conductive layer 130 is removed. This step can separate the conductive layer 130 into the connection pad 13a and the connection pad 13b and form the opening H1 that exposes at least a portion of each of the connection pads 11a and 11b below the connection pads 13a and 13b. The insulating layer 12 and the conductive layer 130 can be partially removed by irradiating them with a laser beam, for example. The connection pad 13a and 13b is formed, and then the connection parts 14 such as wirings as illustrated in FIG. 3A may be formed.

Using the method through FIG. 17 to FIG. 19, the wiring board 1 can be manufactured. The method example in the embodiment, includes partially removing the insulating layer 12 and the conductive layer 130 to form the opening H1 that exposes the connection pads 11a and 11b. Therefore, even when the distance between the connection pads having different sizes become narrow, if seen from X-Y plane, the connection pads are apart from each other in the Z-axis direction, and thus the method example can easily form the connection pads.

(Method Example of Manufacturing the Semiconductor Device)

Figure 20:
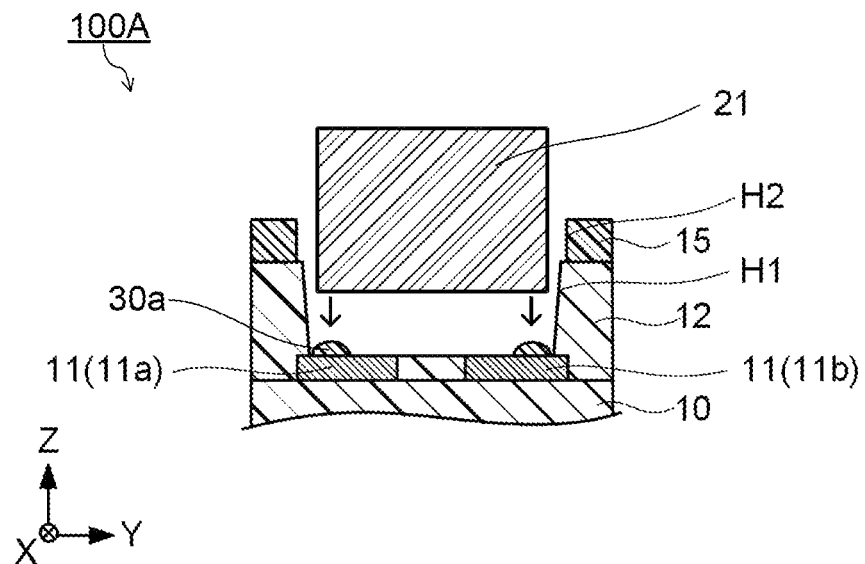
FIG. 20 is a schematic cross-sectional view illustrating the structure example of the semiconductor device 100A.
Figure 21:
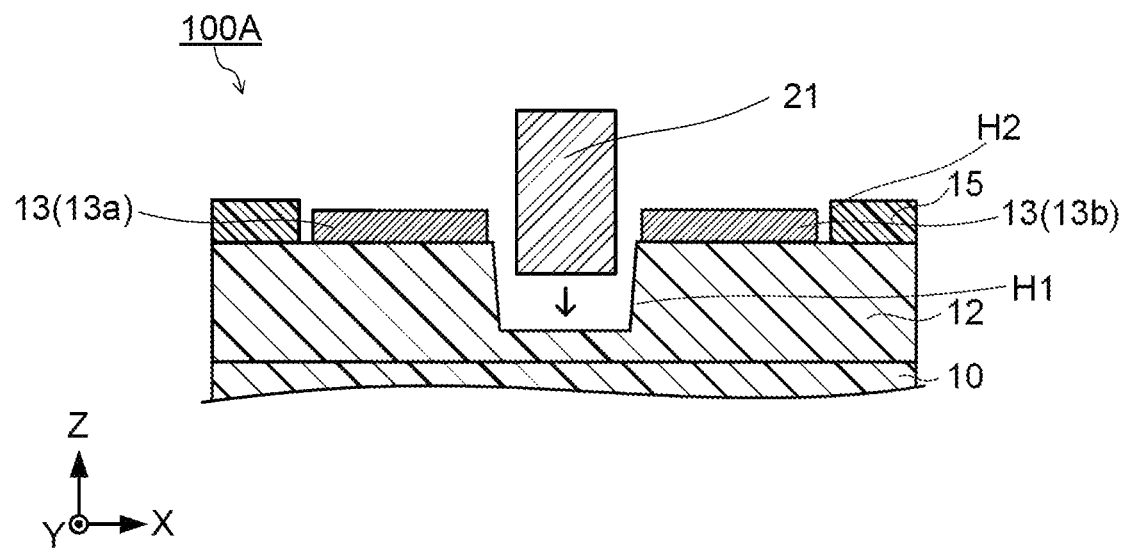
FIG. 21 is a schematic cross-sectional view illustrating the structure example of the semiconductor device 100A.

A method example of manufacturing the semiconductor device 100A when the chip component 21 is mounted on the wiring board 1 is explained with reference to FIG. and FIG. 21. FIG. 20 is a schematic cross-sectional view illustrating the structure example of the semiconductor device 100A, taken along the line segment A1-B1 of FIG. 17. FIG. 21 is a schematic cross-sectional view illustrating the structure example of the semiconductor device 100A, taken along the line segment A2-B2 of FIG. 17. For each of the parts of the wiring board 1 illustrated in FIG. 20 and FIG. 21 corresponding to the parts of the wiring board 1 illustrated in FIG. 17, FIG. 18, and FIG. 19, an explanation for the parts of the wiring board 1 illustrated in FIG. 17, FIG. 18, and FIG. 19 can be appropriately cited if necessary.

When mounting the chip component 21 on the wiring board 1, as illustrated in FIG. 20 and FIG. 21, solder 30a is applied onto the surfaces of the connection pads 11, and the connection pads 11 and connection terminals of the chip component 21 are bonded together via the solders 30a. The solder 30a is applied by using a jet dispenser, for example. The solder 30a is formed by using a metal material such as silver, for example.

Figure 22:
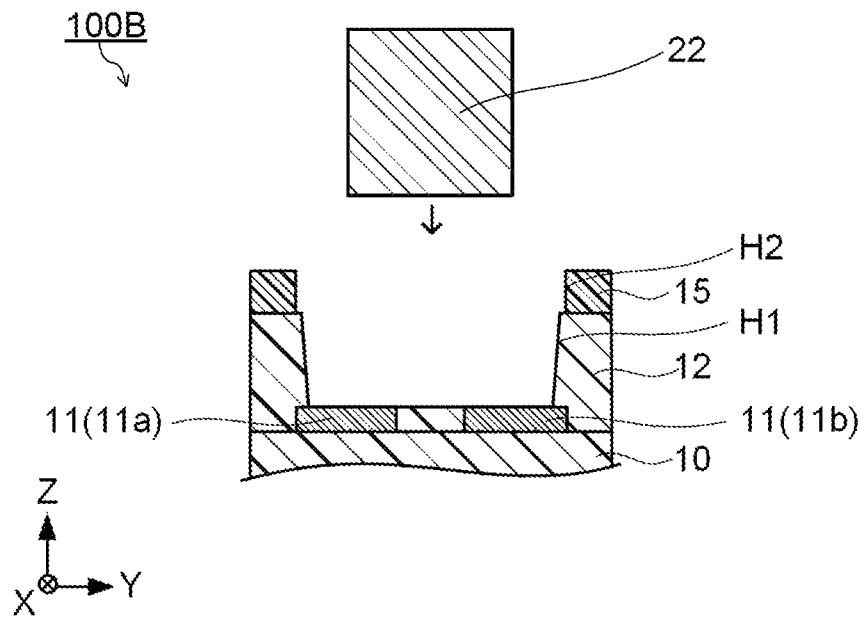
FIG. 22 is a schematic top view illustrating the structure example of the semiconductor device 100B.
Figure 23:
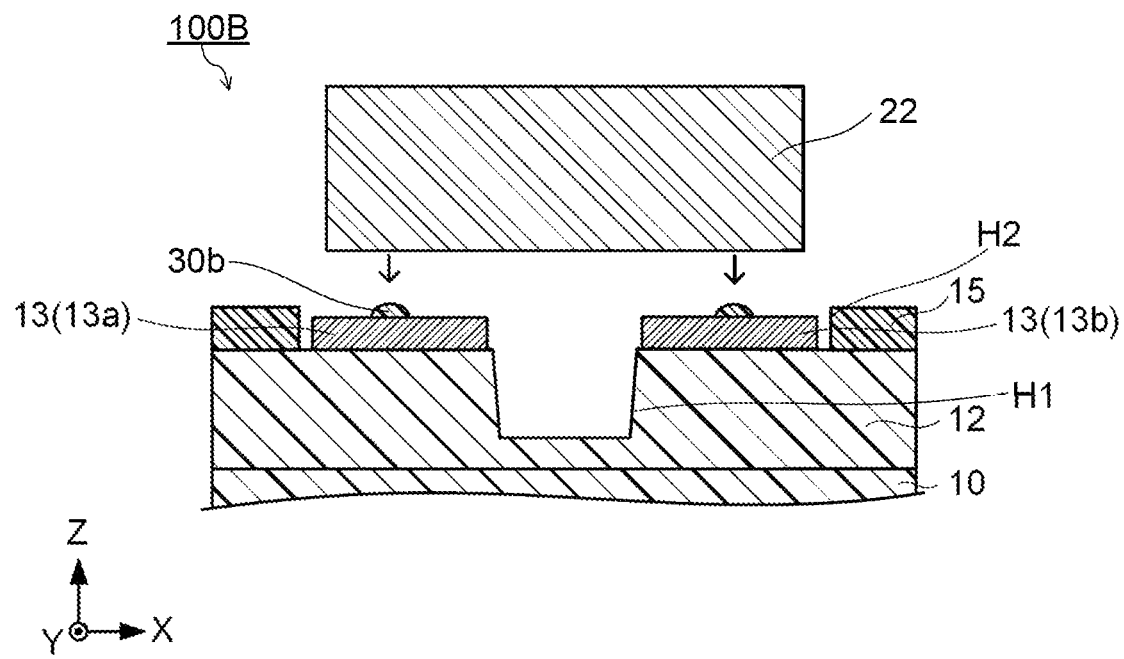
FIG. 23 is a schematic cross-sectional view illustrating the structure example of the semiconductor device 100B.

A method example of manufacturing the semiconductor device 100B when the chip component 22 is mounted on the wiring board 1 is explained with reference to FIG. 22 and FIG. 23. FIG. 22 is a schematic cross-sectional view illustrating the structure example of the semiconductor device 100B, taken along the line segment A1-B1 of FIG. 17. FIG. 23 is a schematic cross-sectional view illustrating the structure example of the semiconductor device 100B, taken along the line segment A2-B2 of FIG. 17. For each of the parts of the wiring board 1 illustrated in FIG. 22 and FIG. 23 corresponding to the parts of the wiring board 1 illustrated in FIG. 17, FIG. 18, and FIG. 19, an explanation for the parts of the wiring board 1 illustrated in FIG. 17, FIG. 18, and FIG. 19 can be appropriately cited if necessary.

When mounting the chip component 22 on the wiring board 1, as illustrated in FIG. 22 and FIG. 23, solder 30b is applied onto the surfaces of the connection pads 13, and the connection pads 13 and connection terminals of the chip component 22 are bonded together via the solders 30b. The solder 30b is applied by using a jet dispenser, for example. The solder 30b is formed by using a metal material such as silver, for example.

(Modified Method Example of Manufacturing the Wiring Board)

Figure 24:
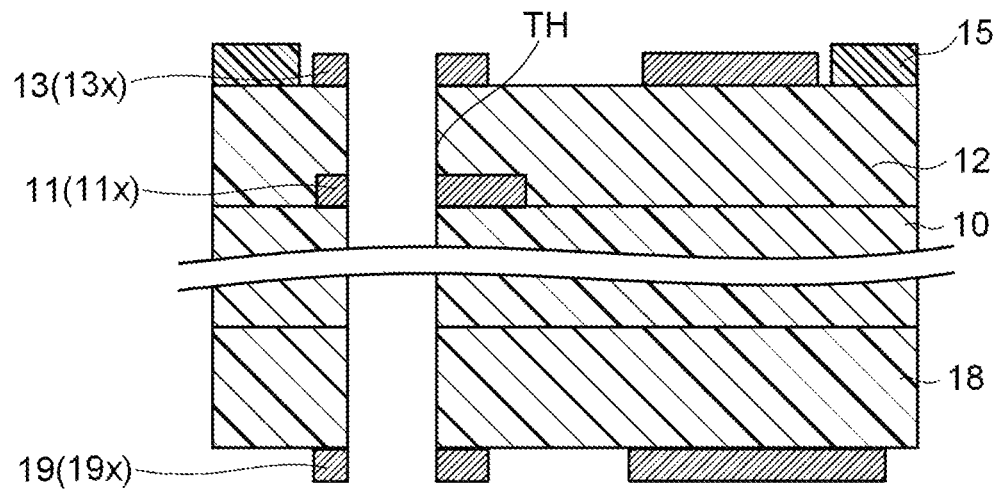
FIG. 24 is a schematic cross-sectional view in the Z-axis direction for explaining a modified method example of manufacturing the wiring board 1.
Figure 25:
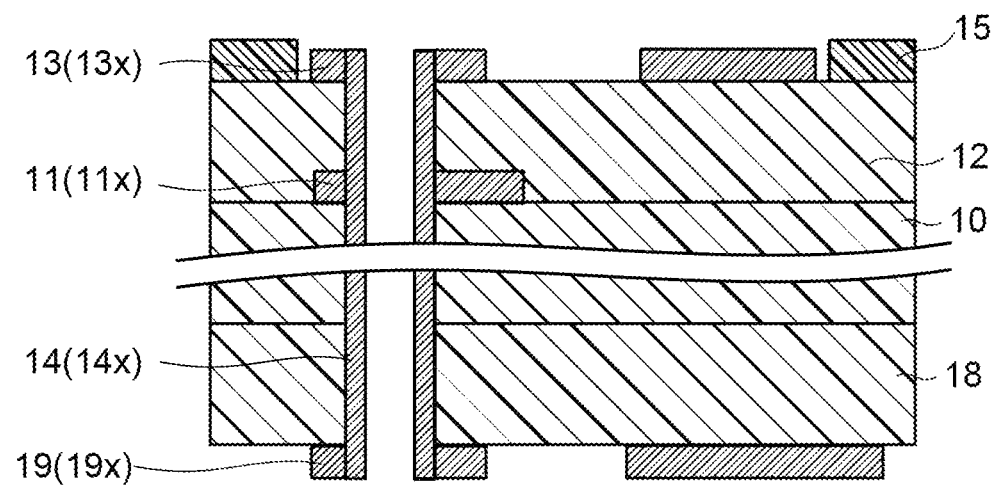
FIG. 25 is a schematic cross-sectional view in the Z-axis direction for explaining the modified method example of manufacturing the wiring board 1.

A modified method example of manufacturing the wiring board is explained with reference to FIG. 24 and FIG. 25. This method example include a step of forming through holes, and a step of forming a conductive layer into the through holes to form a plurality of vias 14. FIG. 24 and FIG. 25 are schematic cross-sectional views in the Z-axis direction illustrating a modified method example of manufacturing one pad portion of the wiring board. For each of the parts of the wiring board illustrated in FIG. 24 and FIG. corresponding to the parts of the wiring board 1 illustrated in FIG. 1, FIG. 2, and FIG. 3A, an explanation for the parts of the wiring board 1 illustrated in FIG. 1, FIG. 2, and FIG. 3A can be appropriately cited if necessary.

As illustrated in FIG. 24, the through hole (referred to as TH in the figure) forming step is a step that penetrates a connection pad 11x, the insulating layer 12, a connection pad 13x, an insulating layer 18, and a connection pad 19x, for example, in the Z-axis direction. The through hole forming step may be performed before or after forming the opening H1 (opening forming step).

The connection pad 11x is one of the connection pads 11. The connection pad 13x is one of the connection pads 13.

The insulating layer 18 is provided on the opposite side of the insulating layer from the insulating layer 12, for example. Examples of the insulating layer 18 include a prepreg, as similar to the insulating layer 10. The wiring board 1 may include another insulating layer or a conductive layer that forms an internal wiring between the insulating layer 10 and the insulating layer 18.

The connection pad 19x is a pad selected from a plurality of connection pads 19. The connection pad 19x has a function as an external connection terminal, for example. The connection pads 19 are provided above the insulating layer 18 from the insulating layer 10. The connection pads 19 can be formed by using the same material and method as those of the connection pads 13, for example.

The through hole TH can be formed by machining using a drill, for example. The through hole TH is formed, and then a desmear process may be performed.

As illustrated in FIG. 25, the via forming step includes forming a conductive layer onto an inner wall surface of the through hole TH to form a via 14x. The conductive layer is formed by, for example, a plating method using a material applicable to the via 14.

The via 14x is a via selected from the vias 14. The via 14x connects the connection pad 11x, the connection pad 13x, and the connection pad 19x.

As described above, the modified method example in the embodiment includes forming the via 14x in the through hole TH, and thus can electrically connects the connection pad 11x and the connection pad 13x.

While certain embodiments have been described, the above-described embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A wiring board, comprising: a first insulating layer; a first pad region provided on the first insulating layer and including at least two first connection pads; a second insulating layer provided on the first connection pads and having a first opening to expose the first connection pads; a second pad region provided on the second insulating layer and including at least two second connection pads; and a third insulating layer provided on the second connection pads, and having a second opening to exposes the first connection pads and the second connection pads, wherein the first connection pad region is smaller than the second connection pad region, one of the first connection pads is directly electrically connected to one of the second connection pads, and another of the first connection pads is directly electrically connected to another of the second connection pads, wherein the first connection pads are arranged in a first direction, the second connection pads are arranged in a second direction intersecting the first direction, and the first connection pads are arranged between one of the second connection pads and another of the second connection pads in the second direction, wherein the first component has a length of 0.4 mm or less and a width of 0.2 mm or less, and the second component has a length of 0.6 mm or more and a width of 0.3 mm or more.

2. The wiring board according to claim 1, wherein the width of each of the first connection pads in the second direction is smaller than the distance between the second connection pads in the second direction, and the distance between the first connection pads in the first direction is smaller than the distance between the second connection pads in the second direction.

3. The wiring board according to 1, wherein the first connection pads are provided for mounting a first component, and the second connection pads are provided for mounting a second component larger in size than the first component.

4. The wiring board according to claim 3, wherein the first component and the second component each are a chip resistor and either one of the chip resistors is mounted on the corresponding connection pads while the other of the chip resistors is not mounted on the other connection pads.

5. The wiring board according to claim 3, wherein the first component and the second component each are a chip capacitor and either one of the chip capacitors is mounted on the corresponding connection pads while the other of the chip capacitors is not mounted on the other connection pads.

6. A semiconductor device, comprising: a wiring board comprising: a first insulating layer; a first pad region above on the first insulating layer and including at least two first connection pads mountable of a first component; a second insulating layer provided on the first connection pads, and having a first opening to expose the first connection pads; a second pad region provided on the second insulating layer and including at least two second connection pads mountable of a second component, a size of the second component is larger than that of the first component; and a third insulating layer provided on the second connection pads, and having a second opening to expose the first connection pads and the second connection pads, in which the first pad region is smaller than the second pad region, wherein one of the first connection pads is directly electrically connected to one of the second connection pads, another of the first connection pads is directly electrically connected to another of the second connection pads, and either one of the first component or the second component is selectively mounted on the corresponding connection pads, wherein the first component has a length of 0.4 mm or less and a width of 0.2 mm or less, and the second component has a length of 0.6 mm or more and a width of 0.3 mm or more.

7. The semiconductor device according to claim 6, wherein
the wiring board further comprise:
the first connection pads; and
the second connection pads,
the first connection pads are arranged in a first direction,
the second connection pads are arranged in a second direction intersecting the first direction, and
the first connection pads are arranged between one of the second connection pads and another of the second connection pads in the second direction.

8. The semiconductor device according to claim 7, wherein
the width of each of the first connection pads in the second direction is smaller than the distance between the second connection pads in the second direction, and
the distance between the first connection pads in the first direction is smaller than the distance between the second connection pads in the second direction.

9. The semiconductor device according to claim 6, wherein
the first connection pads are provided for mounting the first component, and the second connection pads are provided for mounting the second component.

10. The semiconductor device according to claim 9, wherein
the first and second components each are a chip resistor.

11. The semiconductor device according to claim 9, wherein
the first and second components each are a chip capacitor.

* * * * *